(12) United States Patent
Ahsan et al.

(10) Patent No.: US 7,408,421 B2
(45) Date of Patent: Aug. 5, 2008

(54) DETERMINING THERMAL ABSORPTION USING RING OSCILLATOR

(75) Inventors: Ishtiaq Ahsan, Wappingers Falls, NY (US); Edward P. Maciejewski, Wappingers Falls, NY (US); Noah D. Zamdmer, Sleepy Hollow, NY (US)

(73) Assignee: International Business Machines Corporation, Armonk, NY (US)

( * ) Notice: Subject to any disclaimer, the term of this patent is extended or adjusted under 35 U.S.C. 154(b) by 38 days.

(21) Appl. No.: 11/428,622

(22) Filed: Jul. 5, 2006

(65) Prior Publication Data

US 2008/0007354 A1     Jan. 10, 2008

(51) Int. Cl.
*H03B 27/00*     (2006.01)
(52) U.S. Cl. .................. 331/57; 331/176; 374/163; 374/179; 374/183; 219/494
(58) Field of Classification Search .................. 331/57, 331/176; 374/163, 179, 183; 219/494
See application file for complete search history.

(56) References Cited

U.S. PATENT DOCUMENTS 6,462,625 B2 * 10/2002 Kim ............................ 331/57

* cited by examiner

*Primary Examiner*—Arnold Kinkead
(74) *Attorney, Agent, or Firm*—H. Daniel Schnurmann; Hoffman Warnick LLC

(57) ABSTRACT

A device and method for determining a thermal absorption of a part of an integrated circuit (IC) are provided. A specially designed ring oscillator including a non-silicided poly-silicon resistor is used for the determination. The parameters of the ring oscillator are designed/tuned so that a delay of the ring oscillator varies predominantly with a variation in a resistance of the non-silicided poly-silicon resistor. The dimensions of the non-silicided poly-silicon resistor are large enough so that the resistance of the non-silicided poly-silicon resistor is immune to the small process variations of the poly-silicon length and width. The resistance of the non-silicided poly-silicon resistor varies with the thermal absorption of the part of the IC. As such, the thermal absorption of the part of the IC may be determined based on the delay of the ring oscillator.

2 Claims, 3 Drawing Sheets

DETERMINING THERMAL ABSORPTION USING RING OSCILLATOR

BACKGROUND OF THE INVENTION

1. Technical Field

The invention relates generally to integrated circuit (IC) design, and more particularly, to a device and method for determining thermal absorption variations across an IC chip.

2. Background Art

In both the 90 nm and the 65 nm technologies and beyond, large variations in the on currents and/or off currents of components/parts may exist within a single IC chip. Factors contributing to such variations include, among others, differences in the thermal absorption on/of parts (at different locations) of a chip, gate length/width variations, field effect transistor (FET) width variations, etc. In the 90 nm and the 65 nm technologies, the thermal absorption variation has become one of the dominant mechanisms for the variations in the on currents and the off currents.

As the on/off current variations are caused by various factors, it is desirable to separate and quantify the contributions of each single factor. It is also desirable to track the variation of a contributing factor itself. Technologies have been developed to monitor the total threshold voltage variations of the FETs using, e.g., a frequency gradient with respect to the voltage of an on-chip ring oscillator. Gate width/length variation may also be detected using, e.g., Nova™ NanoSEM available from FEI company.

However, according the present state of the art technologies, no satisfactory solution exists for determining/monitoring the thermal absorption variations across an IC chip. As such, there is a need for such a solution.

SUMMARY OF THE INVENTION

A device and method for determining a thermal absorption of a part of an integrated circuit (IC) are provided. A specially designed ring oscillator including a non-silicided poly-silicon resistor is used for the determination. The parameters of the ring oscillator are designed/tuned so that a delay of the ring oscillator varies predominantly with a variation in a resistance of the non-silicided poly-silicon resistor. The dimensions of the non-silicided poly-silicon resistor are large enough so that the resistance of the non-silicided poly-silicon resistor is immune to the small process variations of the poly-silicon length and width. The resistance of the non-silicided poly-silicon resistor varies with the thermal absorption of the part of the IC. As such, the thermal absorption of the part of the IC may be determined based on the delay of the ring oscillator.

A first aspect of the invention provides a ring oscillator device comprising: an inverter circuit; a non-silicided poly-silicon resistor coupled to an output of the inverter circuit; and a decoupling capacitor coupled between the output of the inverter circuit and a ground; wherein parameters of the inverter circuit and the non-silicided poly-silicon resistor are tuned so that a delay of the ring oscillator varies predominantly with a variation in a resistance of the non-silicided poly-silicon resistor and a dimension of the non-silicided poly-silicon resistor is large compared to a process variation in the dimension of the non-silicided poly-silicon such that the resistance is insensitive to the process variation.

A second aspect of the invention provides a device for measuring local thermal absorption of various areas of an integrated circuit (IC), the device comprising: an inverter circuit; a non-silicided poly-silicon resistor coupled to an output of the inverter circuit; and a decoupling capacitor coupled between the output of the inverter circuit and a ground; wherein parameters of the inverter circuit and the non-silicided poly-silicon resistor are tuned so that a delay of the ring oscillator varies predominantly with a variation in a resistance of the non-silicided poly-silicon resistor and a dimension of the non-silicided poly-silicon resistor is large compared to a process variation in the dimension of the non-silicided poly-silicon such that the resistance is insensitive to the process variation.

A third aspect of the invention provides a method for non-destructively determining a thermal absorption of a part of an integrated circuit, the method comprising: positioning a ring oscillator one of nearby and within the part, the ring oscillator including an inverter circuit, a non-silicided poly-silicon resistor coupled to an output of the inverter circuit, and a decoupling capacitor coupled between the output of the inverter circuit and a ground; measuring a delay of the ring oscillator when the integrated circuit is functioning; determining a resistance of the non-silicided poly-silicon resistor based on the delay of the ring oscillator; and determining the thermal absorption of the part of the integrated circuit based on the resistance of the non-silicided poly-silicon resistor; wherein parameters of the inverter circuit and the non-silicided poly-silicon resistor are tuned so that a delay of the ring oscillator varies predominantly with a variation in the resistance of the non-silicided poly-silicon resistor, the resistance primarily sensitive to the thermal absorption of the part.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements among the drawings.

DETAILED DESCRIPTION

The present invention is created based on, among others, the understanding that the sheet resistance of a non-silicided poly-silicon resistor varies with a variation in the surrounding temperature. As such, a value of the sheet resistance of a non-silicided poly-silicon resistor can be used to indicate/measure a temperature of a part of an IC chip, which is directly related to/reflects a thermal absorption thereof. The next question is to develop a device that can take advantage of the above mentioned thermal characteristic of a non-silicided poly-silicon resistor. Preferably, such a device should work without affecting the functioning of an IC chip to be measured. This enables characterization of the within chip thermal absorption variation of a real functional chip, which can be sold in the market. It is also desirable that the determination of the thermal absorption of an IC chip requires no destruction of the same. A ring oscillator does not interrupt the functioning of an IC chip. Based on the above, the current invention creates and uses a specially designed ring oscillator to determine a thermal absorption of a part of an IC chip.

Figure 1:
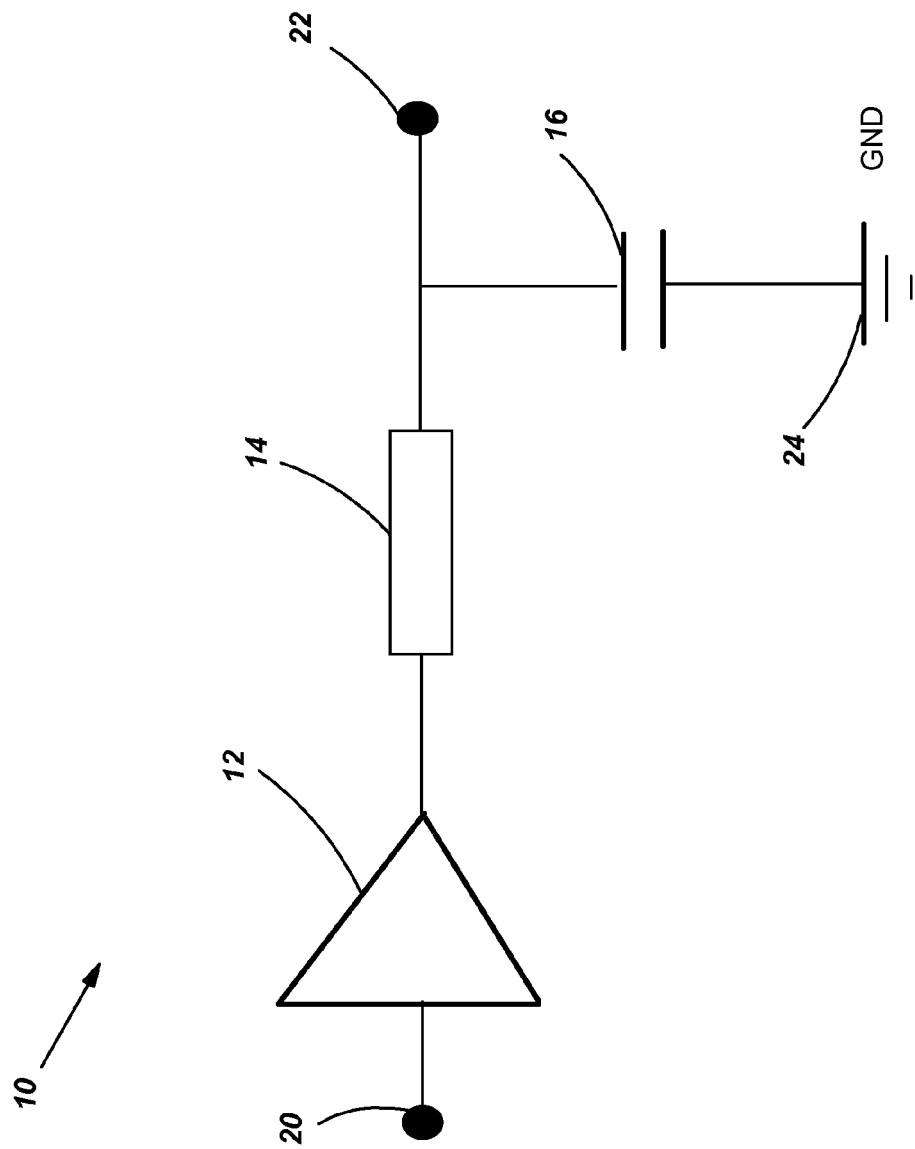
FIG. 1 shows a block diagram of a stage of a ring oscillator device according to one embodiment of the invention.

Turning to the drawings, FIG. 1 shows a block diagram of a stage of a ring oscillator device 10 according to one embodiment of the invention. As shown in FIG. 1, ring oscillator 10 includes an inverter 12, e.g., a complementary metal oxide semiconductor (CMOS) inverter; a non-silicided poly-silicon resistor 14; and a decoupling capacitor (capacitor) 16, all between input port 20 and output port 22. non-silicided poly-silicon resistor 14 is coupled to the output of inverter 12, and is positioned between the output of inverter 12 and output port 22 of ring oscillator 10. Capacitor 16 is coupled between the output of inverter 12 and a ground 24. FIG. 1 shows that capacitor 16 is positioned after non-silicided poly-silicon resistor 14, which is a preferable configuration, but does not necessarily limit the scope of the invention. The parameters of inverter 12, non-silicided poly-silicon resistor 14 and capacitor 16 should be carefully designed/tuned so that the delay of ring oscillator 10 varies predominantly with and is sensitive to a variation in a resistance of non-silicided poly-silicon resistor 14. For example, according to one embodiment, the CMOS transistors (not shown) that constitute inverter 12 may be made with long and wide devices so that there are very little relative variations in inverter 12 parameters. As a consequence, the delay of ring oscillator 10 is not sensitive to the variations in inverter 12 parameters, and the range of the variations in the delay of ring oscillator 12 is also not limited by inverter 12 parameters. The parameters of non-silicided poly-silicon resistor 14 and capacitor 16 may also be selected so that the delay of ring oscillator 10 will not vary substantially with or be sensitive to the potential variations in the capacitance of capacitor 16. For example, non-silicided poly-silicon resistor 14 may be fabricated with long and wide devices, and be lightly doped so that non-silicided poly-silicon resistor 14 has a large base resistance. As a consequence, even if the resistance of non-silicided poly-silicon resistor 14 decreases due to temperature variations, the decreased resistance value of non-silicided poly-silicon resistor 14 may still dominate capacitor 16 in influencing the delay of ring oscillator 10. For another example, dimensions of non-silicided poly-silicon resistor 14 are large compared to a process variation in the dimensions of the non-silicided poly-silicon such that the resistance is insensitive to the process variation.

Multiple ring oscillators 10 may be positioned about, i.e., within or nearby multiple parts of an IC chip to determine the thermal absorptions thereof. According to one embodiment, the multiple ring oscillators 10 may be fabricated on the IC chip (on-chip) as built-in-self-test (BIST) devices to determine variations in thermal absorptions across the chip. According to an alternative embodiment, ring oscillator 10 may be a separate device (off-chip) that is attached to an IC chip to determine the thermal absorption variations across the chip.

Figure 3:
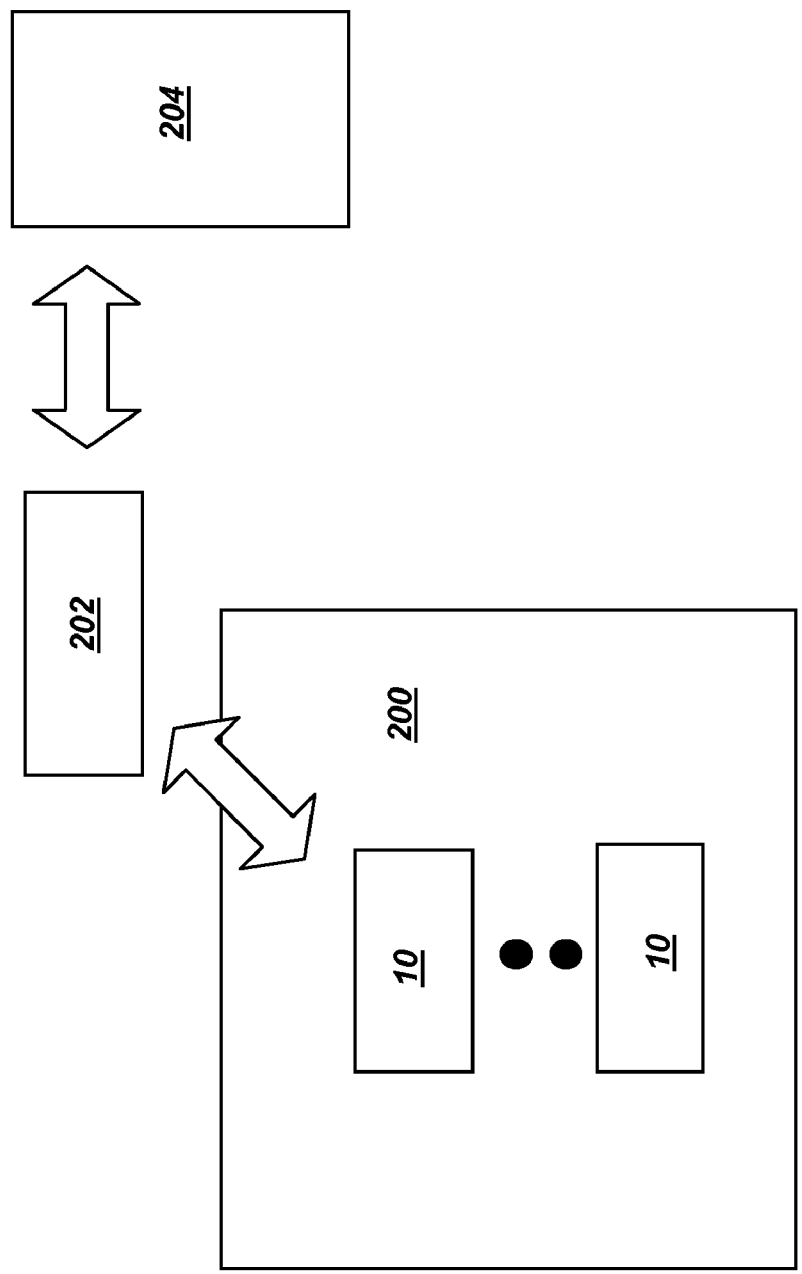
FIG. 3 shows the measurement device in a computer system.

In operation, as shown in FIG. 3, during a functioning state of an IC chip 200, a delay of a ring oscillator 10 may be measured by a measurement device 202 and sent to, e.g., a computer system 204 to determine a resistance of non-silicided poly-silicon resistor 14 based on the delay. The computer system 204 then determines a temperature based on the determined resistance of non-silicided poly-silicon resistor 14. As is appreciated, the temperature reflects thermal absorption of the part of the IC chip. Following this procedure, the thermal absorption variations of the multiple parts of the IC chip can be determined.

Figure 2:
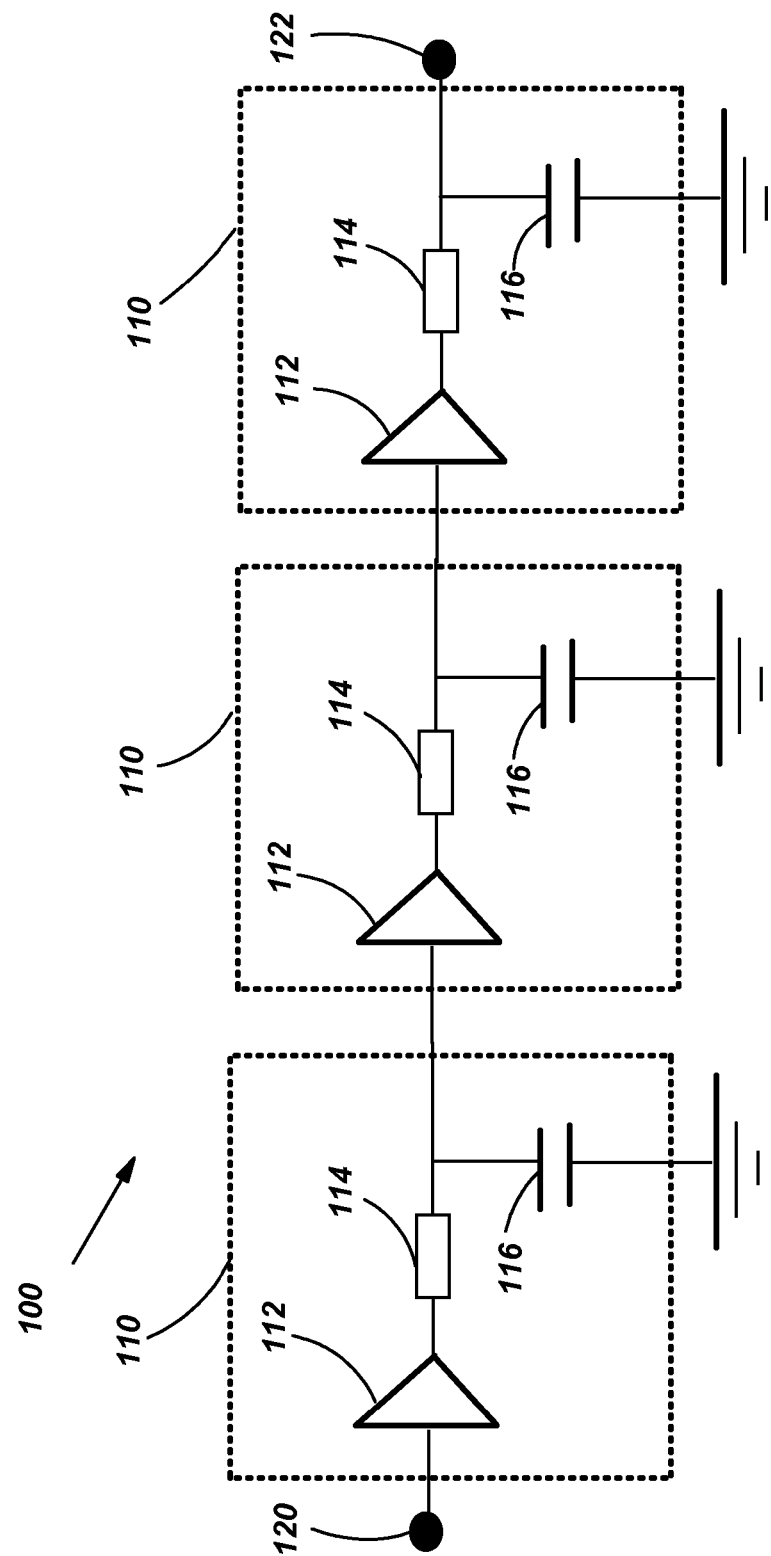
FIG. 2 shows an alternative embodiment of a ring oscillator device including three stages according to the invention.

Ring oscillator 10 shown in FIG. 1 includes only one stage, i.e., one inverter 12. It should be appreciated that ring oscillator 10 may typically include any odd number of stages, and all are included in the current invention. For example, FIG. 2 shows an alternative embodiment of ring oscillator 100 including three stages 110. Each stage 110 includes an inverter 112, a non-silicided poly-silicon resistor 114 and a decoupling capacitor 116. Preferably, inverters 112, non-silicided poly-silicon resistors 114 and decoupling capacitors 116 are tuned to be of the same sizes, respectively, to facilitate the analyses and the calculation of the delay-resistance relationship. However, other configurations are also included in the invention.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method for non-destructively determining a thermal absorption of a part of an integrated circuit, the method comprising:

one of positioning a ring oscillator nearby the part or positioning the ring oscillator within the part, the ring oscillator including an inverter circuit, a non-silicided poly-silicon resistor coupled to an output of the inverter circuit, and a decoupling capacitor coupled between the output of the inverter circuit and a ground;

measuring a delay of the ring oscillator when the integrated circuit is functioning;

determining a resistance of the non-silicided poly-silicon resistor based on the delay of the ring oscillator; and determining the thermal absorption of the part of the integrated circuit based on the resistance of the non-silicided poly-silicon resistor;

wherein parameters of the inverter circuit and the non-silicided poly-silicon resistor are tuned so that a delay of the ring oscillator varies predominantly with a variation in the resistance of the non-silicided poly-silicon resistor, the resistance primarily sensitive to the thermal absorption of the part.

2. The method of claim 1, further including positioning multiple ring oscillators about multiple places across the integrated circuit and determining thermal absorptions of the multiple places.

* * * * *